US006812685B2

(12) United States Patent
Steber et al.

(10) Patent No.: US 6,812,685 B2
(45) Date of Patent: Nov. 2, 2004

(54) AUTO-SELECTING, AUTO-RANGING CONTACT/NONCONTACT VOLTAGE AND CONTINUITY TESTER

(75) Inventors: George R. Steber, Mequon, WI (US); David L. Wiesemann, Pewaukee, WI (US); Thomas M. Luebke, Menomonee Falls, WI (US)

(73) Assignee: Actuant Corporation, Glendale, WI (US)

( * ) Notice: Subject to any disclaimer, the term of this patent is extended or adjusted under 35 U.S.C. 154(b) by 85 days.

(21) Appl. No.: 10/076,718

(22) Filed: Feb. 13, 2002

(65) Prior Publication Data

US 2002/0135349 A1 Sep. 26, 2002

Related U.S. Application Data

(60) Provisional application No. 60/277,910, filed on Mar. 22, 2001.

(51) Int. Cl.[7] ........................ G01R 31/02; G01R 11/57; G01R 15/00; G01R 15/08; G01D 1/14
(52) U.S. Cl. .................... 324/72.5; 324/76.18; 324/115
(58) Field of Search ............................... 324/72.5, 115, 324/76.18

(56) References Cited

U.S. PATENT DOCUMENTS

| | | | | |
|---|---|---|---|---|
| 5,103,165 A | * | 4/1992 | Sirattz | 324/133 |
| 5,250,893 A | * | 10/1993 | Gambill et al. | 324/115 |
| 5,481,185 A | | 1/1996 | Lane et al. | 324/145 |
| 5,612,616 A | | 3/1997 | Earle | 324/72.5 |
| 5,877,618 A | | 3/1999 | Luebke et al. | 324/72.5 |
| 6,043,640 A | | 3/2000 | Lauby et al. | 324/127 |
| 6,265,865 B1 | * | 7/2001 | Engel et al. | 324/207.2 |

* cited by examiner

*Primary Examiner*—Anjan Deb
*Assistant Examiner*—John Teresinski
(74) *Attorney, Agent, or Firm*—Quarles & Brady LLP

(57) ABSTRACT

An electrical testing device has non-contact AC voltage sensing, single probe contact AC voltage testing and voltage metering functions. Non-contact voltage sensing is used to detect the vicinity of a live AC conductor and single probe contact sensing is used to determine which conductor of a number of conductors in the vicinity is live. More specific information about the magnitude of the voltage can then be determined using both contact probes. The electrical testing device automatically determines the type (AC or DC) and polarity (if DC) of a voltage applied to test terminals, and provides an indication of the voltage range (AC or DC), without the need to operate any switches or other electrical actuators.

3 Claims, 2 Drawing Sheets

AUTO-SELECTING, AUTO-RANGING CONTACT/NONCONTACT VOLTAGE AND CONTINUITY TESTER

CROSS REFERENCE TO RELATED APPLICATION

This claims the benefit of U.S. Provisional Patent Application No. 60/277,910 filed Mar. 22, 2001.

FIELD OF THE INVENTION

The present invention relates to electrical testing equipment, and more specifically to an electrical testing device which combines voltage sensing functions with voltage metering and continuity functions.

BACKGROUND OF THE INVENTION

In electrical installations such as those found in manufacturing facilities, large buildings, and even residential housing, electrical wiring related to a number of electrical functions and applications is often bundled together or threaded through a single conduit. The wiring is often confined to small, poorly lit areas of a building, both for aesthetic and practical reasons. Such installations serve an aesthetic purpose in maintaining unsightly wires behind panels or other covering devices. From a practical standpoint, such installations maintain wiring off of floors, thereby decreasing the possibility of accidental damage to the wiring and preventing accidental intervention between people or equipment and electrical wiring.

While maintaining wiring in confined areas makes a great deal of practical sense, such installations can cause significant problems for electricians, technicians, and maintenance personnel faced with the need to troubleshoot electrical wiring problems. For example, when one of a number of conductors in a given installation fails to operate correctly, electrical testing personnel are faced with the problem of quickly determining which of a number of possible conductors has failed. Although conductors are often marked, the markings can be difficult to detect when a number of conductors are bundled together, or when lighting conditions are poor, as is frequently the case in electrical installations. Therefore, the act of locating an appropriate conductor for testing can be a daunting task. Once the appropriate conductor or conductors have been found, additional testing is often required to locate a fault or to verify appropriate operation of a device. A number of tests may be required, including continuity checks to verify the integrity of conductors, AC voltage measurements, and DC voltage measurements. Therefore, a number of electrical tests must be conducted to correct a typical electrical fault.

Although electrical troubleshooting of the type described above can be done using a typical voltage testing device, such as an analog or digital multimeter or voltage tester capable of measuring AC and DC voltages, all of these devices suffer from a number of disadvantages. All of these devices, for example, require the connection of two leads to a conductive point of a circuit to verify a voltage. The electrician must identify both a positive (hot) and negative (neutral) lead, and either locate open terminals coupled to the conductors or pierce the insulation of the conductors to measure the voltage on the leads. This procedure is time consuming, particularly when a large number of conductors are involved. Furthermore, measurement procedures with typical meters require the use of both hands, and are therefore particularly difficult when the user is isolating one or more conductors from a bundle. Complicating matters, many testing devices require the user to operate a number of switches or other electrical activation devices to select a type and expected range of a voltage to be tested before a measurement can be taken. When using a meter of this type, an electrician or technician must simultaneously identify and isolate the appropriate connectors from a bundle, maintain a connection between the conductors and the voltage probes, and operate switches on the metering device. Measurements of this type are extremely difficult, and can require the participation of two or more electricians or technicians.

In some applications, testing can be simplified through the initial use of a non-contact sensor. The non-contact sensor includes a conductive element that, when placed near an AC conductor, provides an indication if an AC voltage is impressed on the conductor. The non-contact sensor, therefore, can be used to determine which of a number of conductors is carrying an AC voltage. In a typical testing situation, therefore, an initial test could be conducted to determine which of a number of AC conductors were "hot", and a voltage tester or multimeter could then be applied to determine conductivity and/or voltage ranges of the conductors in question. However, to troubleshoot equipment as described, multiple pieces of test equipment are required. Upon isolating a conductor in which a fault has been located, the user must drop the test equipment, and start over with an additional piece of equipment. Again, a substantial amount of time can be lost, merely in re-locating the appropriate conductor for testing.

SUMMARY OF THE INVENTION

The present invention is a multi-functional voltage measuring device which provides circuitry for quickly and easily locating and isolating active conductors from among a plurality of conductors, as well as circuitry for detecting a voltage type and magnitude on the conductor.

To find and isolate a conductor for testing, the device provides the capability of quickly and easily detecting the presence of an active conductor. This capability can be provided through non-contact voltage sensing, single probe voltage sensing, or both. The non-contact voltage sensing employs a sensor for detecting the general vicinity of a conductor carrying an AC voltage without the need for electrical contact between the sensor and the conductor. Therefore, AC voltages can be sensed without the need to strip wires or find an open contact point. Single probe voltage sensing allows the user to determine whether a conductor has an AC voltage impressed upon it by electrically coupling a single probe of the voltage measuring device to the conductor. Therefore, the user does not have to find both a "hot" and a "neutral" side of a voltage to determine whether an AC voltage is impressed upon it. Significantly, both non-contact voltage sensing and single probe sensing require the use of only one hand, thereby leaving the other hand free to isolate a conductor from a bundle. Circuitry associated with these functions provides an indication of the presence of an AC voltage, through at least one of a visual display, such as a flashing LED indicator, and an aural signal, such as an alarm. It is not necessary, therefore, for the user to closely monitor a display to locate an active conductor.

Once a conductor carrying an AC voltage is detected, the user can use both probes to determine additional information about the conductor or conductors under test, such as the magnitude, type, and polarity of the voltage carried by the conductor or conductors. When using both probes, the device provides a number of functions automatically, thereby minimizing the need to activate a number of switches, and simplifying operation, particularly for the single user who can devote only two hands to testing. The device preferably automatically determines the type (AC or DC) and polarity of DC voltages under test, and is preferably auto-ranging, providing a visual indication of the range of the voltage being tested without the need to activate switches or other actuating devices. The device can also includes a continuity check circuit, which is also automatically available to the user without the need to select a continuity function. To further reduce the requirement for switches or electrical actuators, the device preferably defaults to a sleep mode, wherein power consumption is minimized until one of a selected number of inputs is received.

A preferred feature of the auto-ranging circuitry is the ability for a single circuit to process both an AC and a DC input voltage and to scale each type of signal appropriately. The circuit includes a resistor and capacitor coupled in series, the capacitor and resistor being electrically coupled to other impedances to provide an impedance divider to AC voltages, while acting as an open circuit to DC voltages. An additional scaling impedance, therefore, is applied to AC voltages, which may have magnitudes as much as two times greater than the magnitude of the applied DC voltages. This circuit minimizes the need for expensive, high-accuracy microprocessors and analog to digital converters, thereby minimizing the cost of the device. Furthermore, the circuit establishes a high impedance connection between the terminals, and therefore allows a batter operated continuity check circuit to be continually connected across the test probes without significant current flow, thereby extending the life of the voltage source powering the continuity check circuit.

These and other objects and advantages of the invention will be apparent from the detailed description and drawings.

BRIEF DESCRIPTION OF THE DRAWINGS

FIG. 1b is an illustration of a rear panel of the embodiment of FIG. 1a.

DETAILED DESCRIPTION OF A PREFERRED EMBODIMENT OF THE INVENTION

Figure 1A:
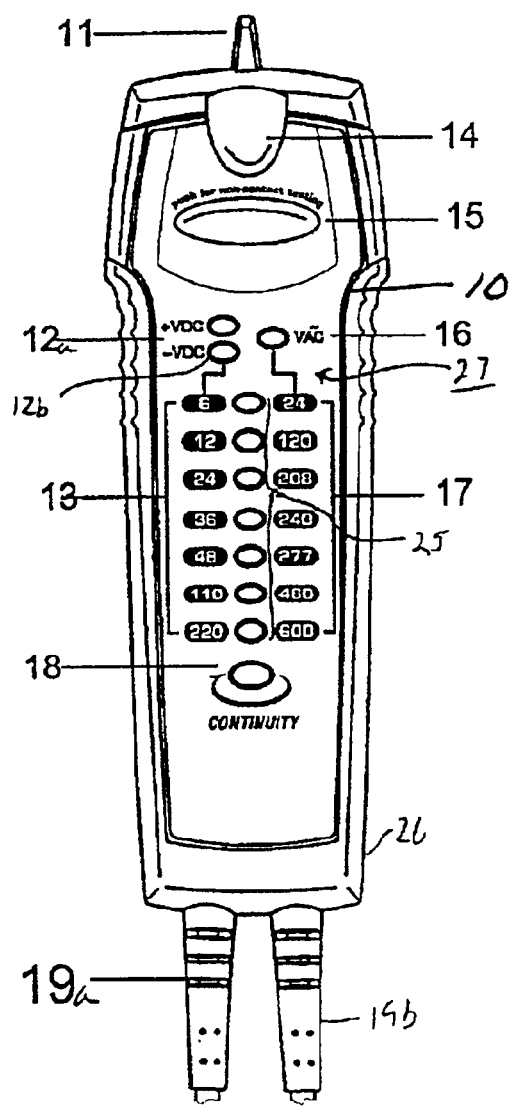
FIG. 1a is an illustration of a front panel of one embodiment of a digital multimeter constructed in accordance with the present invention.
Figure 1B:
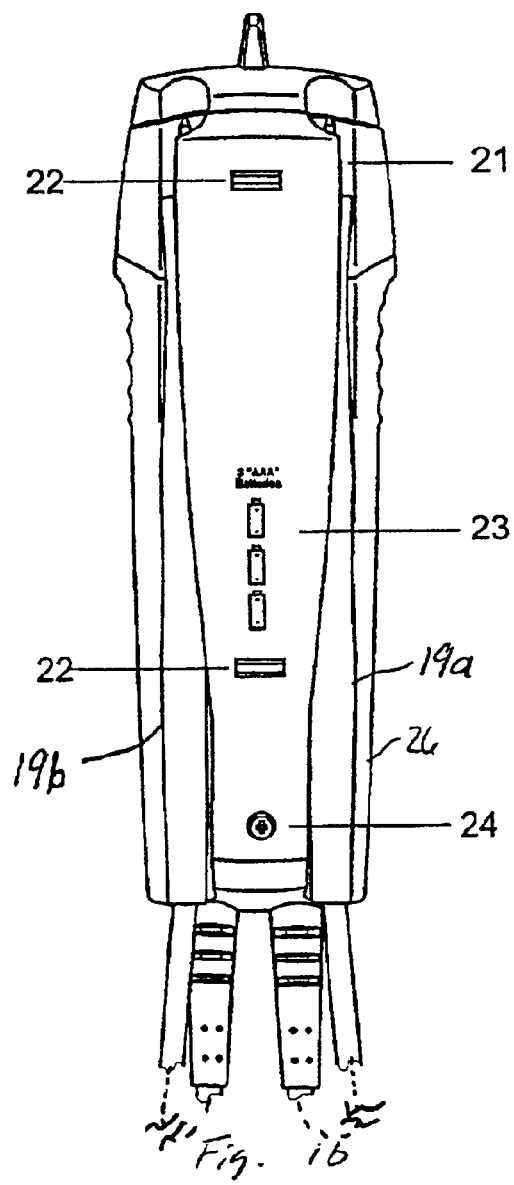

Referring first to FIGS. 1a and 1b, a front and rear view of an electrical testing device constructed in accordance with the present invention is shown. The electrical testing device includes a front panel 10, comprising a display and a momentary pushbutton 15; a non-contact AC voltage sensor 11; and first and second voltage probes 19a and 19b, respectively, which are also referred to hereafter as the RED and BLACK leads. The RED and BLACK leads are stored in two open pockets as shown in FIG. 1b when they are not in use. All of the components of the electrical testing device are enclosed in a housing 26, which preferably comprises an impact resistant rubberized material.

The display comprises a plurality of indicator lights for providing visual feedback related to voltages tested at the voltage probes 19a and 19b and at the non-contact sensor 11. The display can include a voltage type (AC or DC) and DC polarity indicator, a voltage scale indicator, a continuity indicator, and an AC voltage sense indicator. As shown in FIG. 1a, the voltage type and polarity indicator comprises three light emitting diodes (LED's) including a positive DC voltage indicator 12a, a negative DC voltage indicator 12b, and an AC voltage indicator 16. These indicators provide a visual indication of the type and polarity of voltage present between the voltage probes 19a and 19b when the conductive tips of the probes are placed in electrical contact with two conductors being probed. The AC voltage sense indicator 14 is also an LED. This LED provides a visual indication that an AC voltage has been detected through either the non-contact probe 11 or through one of the test probes 19a or 19b through the non-contact or single probe test modes described below. The voltage scale indicator includes a plurality of LED's 25 located between a DC and an AC voltage scale on the front panel, and are used in conjunction with the scales to provide a voltage range reading to the user of the device. The voltage scales comprise a plurality of common voltage levels likely to be encountered in voltage testing situations, and are printed or otherwise provided on the front panel. The continuity LED indicator 18 provides an indication that continuity has been established between the voltage probes 19a and 19b, described below. The momentary pushbutton 15 is used to enable an AC voltage sense circuit which provides the non-contact and single probe contact AC voltage sensing modes. The non-contact sensor 11 and voltage probes 19a and 19b are used to test voltages on and/or continuity of conductors, as described below.

Now, referring to FIG. 1b, the rear panel of the electrical testing device of the present invention is shown. The rear panel includes a test lead storage area 21 having the two previously mentioned open pockets wherein each of the voltage leads 19a and 19b can be snap fit for storage. The rear panel further includes one or more magnets, which are shown at two magnet mounting locations 22. The magnets allow the electrical testing device to be held to a metal beam, circuit breaker panel, or other location, thereby freeing the user's hands. The rear panel further comprises a battery compartment, shown at 23, held in place by a battery compartment screw 24. The battery compartment 23 provides a storage location for batteries or other energy storage devices for providing power to the electrical test device.

Figure 2:
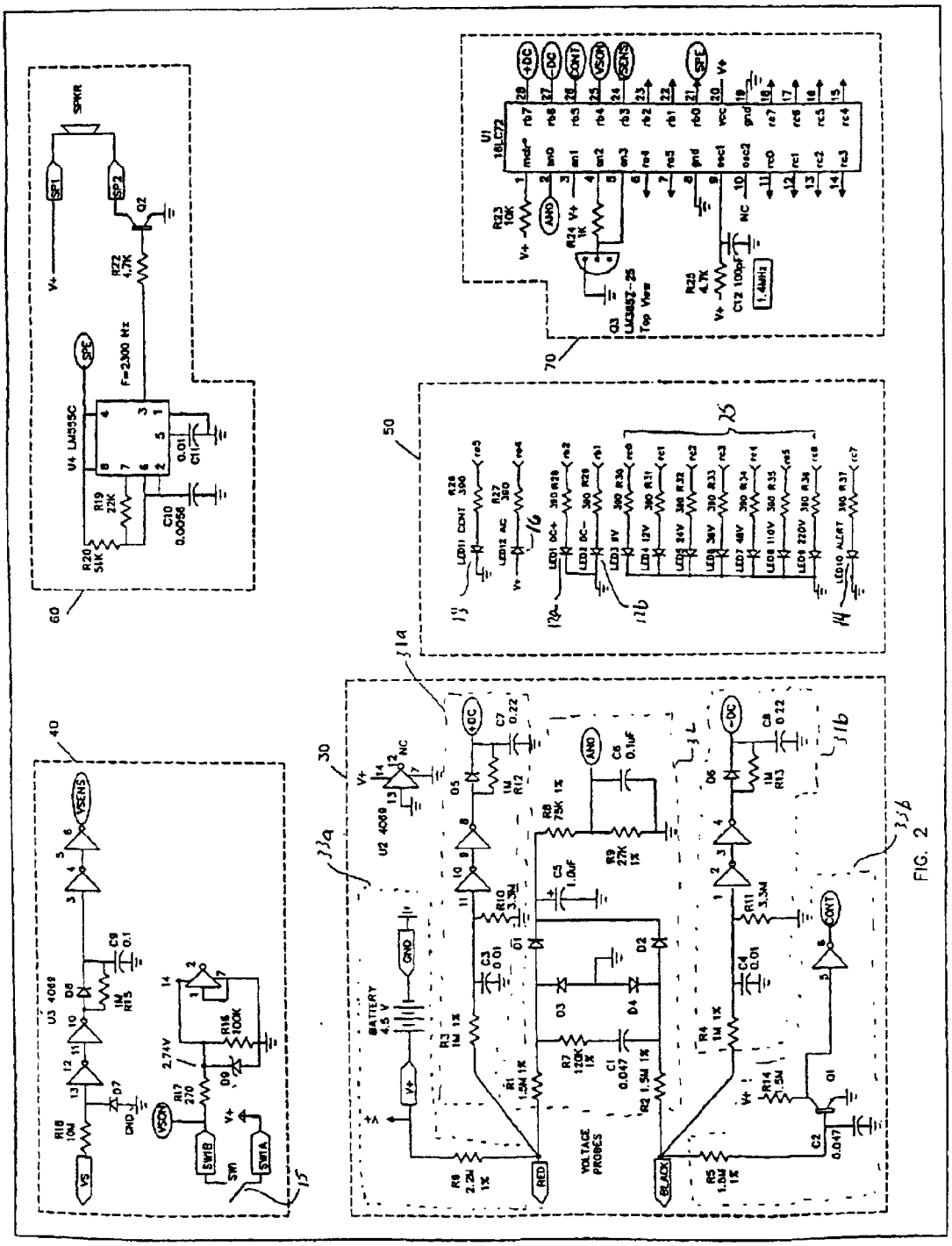
FIG. 2 is a schematic diagram of one embodiment of a circuit constructed in accordance with the present invention.

Refer now to FIG. 2. An electrical schematic diagram of the circuitry of the invention includes a number of functional block circuits. The Block 30 contains a voltage type and polarity circuit 31a and 31b, voltage range circuit 32, and continuity check circuit 33a and 33b. Block 40 includes the AC voltage sense circuit for performing single probe AC voltage sensing either through the non-contact sensor 11 (VS) or through an electrical connection with either voltage probe 19a or 19b, as described below. Block 50 contains the display circuitry, comprising the LED indicator lights 12a, 12b, 16, and 25 described above. Block 60 contains audio circuitry that can be selectively activated to cause sound to be emitted from the electrical test device. Block 70 comprises digital logic and control circuitry, which preferably comprises a microprocessor U1, as shown.

Referring now to Block 30 of FIG. 2. The VOLTAGE PROBES, or test leads 19a and 19b (FIG. 1a) are connected to points RED and BLACK to provide the means to sense external voltages and to perform the continuity function. The test leads or probes 19 can be coupled to a number of different types of electrical input signals including positive and negative DC voltages, AC voltages, or the opposing sides of any conductor to provide a continuity check. The outputs from block 30 include the digital output signals +DC and −DC, which provide digital signals to the microprocessor block 70 indicative of whether the applied input signal is a DC or an AC signal; an analog signal AN0 which provides a signal to the microprocessor block 70 indicative of the magnitude of the electrical input signal; and a digital signal CONT, which is supplied to the microprocessor block 70 to provide an indication of whether continuity exists between the RED and BLACK terminals. The circuitry of block 30, therefore, provides an indication of the type, polarity, and magnitude of a voltage between the test leads 19 without the need for activating a switch or button. A continuity check can also be performed automatically, without the need to actuate a switch or other device.

Consider now the processing of a voltage by the voltage type and polarity circuit 31*a* and 31*b*. First, consider an AC voltage or a positive DC voltage supplied between the RED and BLACK terminals. The AC voltage or positive DC voltage is sensed and processed by components R3, C3, R10, D5, R12, C7 and the inverters comprising pins 11, 10, 9 and 8 of U2. The resistors R3 and R10 divide the input voltage by a predetermined amount dependent on the expected range of input values. The resultant output signal is then input to first and second inverters of U2. The inverters amplify AC signals presented at the input pin 11 of U2, by, for example, converting an input sine wave to a square wave. The inverters, however, do not affect DC signals which are initially inverted at pin 10, but are then inverted back to their initial polarity at pin 8. The combination of D5, R12, and C7 rectifies AC input signals to provide a stable logic level output signal at DC, but again has little affect on a DC input signal. The output of the circuit is a DC voltage presented to point +DC. The voltage at point +DC is logic high (3 to 4.5 volts) when a positive DC voltage or AC voltage is sensed at RED and BLACK inputs provided it has a sufficiently high (in magnitude) value. Sufficiently high, using the components shown in FIG. 2, is typically 5 volts (AC or DC) but could be changed by different component value selection. If the input voltage at the inputs is not above this threshold, the voltage at +DC is a logic low (near zero volts). Note that, when a DC input signal is presented between the RED and BLACK input terminals, a logic low will appear at the −DC output because the signal will not meet the predetermined threshold established by circuit 31*b* comprising components R4, C4, R11, U2, D6, R12 and C8 described below. Also, because a minimum input voltage is required, a logic high output signal will not result at the +DC output when the RED and BLACK terminals are coupled to a conductor for purposes of conducting a conductivity check.

Consider now the processing of an AC voltage or a negative DC voltage applied between the BLACK and RED leads by the voltage type and polarity circuit 31*b*. The negative DC or AC voltage is sensed and processed by components R4, C4, R11, D6, R13, C8, and the inverters comprising pins 1, 2, 3 and 4 of U2. The operation of this circuitry is identical to the operation of components R3, C3, R10, D5, R12, C7, and inverters of U2 as described above. The result is a voltage at point −DC. The point −DC is logic high when a negative DC voltage or AC voltage is sensed at RED and BLACK inputs and has a sufficiently negative magnitude. This input value is typically −5 volts but could be changed by different component value selection. If the input voltage at the inputs is not below this threshold, the voltage at −DC is a logic low. The two points +DC and −DC provide logic level inputs to the microprocessor block 70, which employs digital logic to determine whether the input signal is an AC, positive DC, or negative DC signal and drives an appropriate LED in the LED block 50. If the +DC is high and −DC is low then the input is construed by the microprocessor block 70 to be a positive DC voltage. On the other hand, if the +DC is low and −DC is high, then the input is a negative DC voltage. If both +DC and −DC are high, then the input is an AC voltage. If the voltage at both of +DC and −DC are low, then the input is deemed to be neither AC or DC.

The voltage at the input (RED and BLACK terminals) is also processed by the voltage range circuit 32. The voltage range circuit 32 provides three functions: attenuation of AC input voltages, rectification of AC signals, and scaling of both AC and DC input voltages to an appropriate level to be processed by a selected analog to digital converter. The AC attenuation circuit preferably employs capacitive elements which process AC and DC input voltages differently, applying a scaling circuit to input AC voltages signals, but allowing DC voltage signals to pass. Although a specific embodiment of a circuit for performing these functions is described below, it will be apparent that a number of different types of rectifying and scaling circuits could be employed while achieving similar results.

The voltage range circuit 32 as shown in FIG. 2 comprises R1, R2, R7, C1, D3, D4, D1, D2, C5, R8, R9, and C6. The processed voltage produced at the point AN0 provides a signal indicative of the magnitude of the voltage applied at the input terminals. The circuitry processes AC and DC voltages uniquely and differently. This is necessary for several reasons. First, the microprocessor U1 can handle only DC voltages, so that AC voltages must be converted to DC before being presented to it. Secondly, the range of the expected AC and DC voltages at the input are substantially different. They must be scaled differently in order to fit within the dynamic range of the analog to digital converter used in the microprocessor. Typically, a microprocessor uses an eight bit analog to digital converter. This means that a dynamic range of the digital result is zero to 255. The circuit shown is calibrated to expect the DC voltages at the input in a range from 5 volts to 220 volts. The expected DC voltages fit nicely into the A/D converter range with the proper attenuation factor. An A/D converter operating from 0 to 2.5 volts input would require an attenuation factor of about 0.01. However, the expected AC voltages are 24 to 600 volts, which is outside of the range of the A/D converter with this attenuation factor. The unique design of this circuitry however compensates for this problem.

In the voltage range circuit 32, the components R7 and C1 form an AC attenuation network in conjunction with R1 and R2. That is to say, AC voltages entering the circuit are reduced in value because the impedance formed by R7 and C1 causes a voltage drop across R1 and R2. By choosing the correct values of these components (R7, C1, R1 and R2), it is possible to cause the AC voltages to have a range that falls within the full scale value of the A/D converter. Values shown on the schematic are representative of this fact and produce an overall attenuation factor for AC voltages of about 0.0045. This attenuation factor causes processed AC voltages, at point AN0, to fall within the range of the A/D converter input. The processed voltage at point AN0 will always be a DC voltage. But it can be interpreted as a DC voltage or AC voltage magnitude at the input depending on the values of +DC and −DC as noted previously. Notice that the components R7 and C1 are effectively not in the circuit for DC voltages since the impedance of a capacitor is infinite to DC voltages. Hence the AC attenuation circuit does not affect the DC processing part of the circuit. The AC and DC voltage processing modes are uniquely separated and are attenuated differently. They are each be scaled to fit the 0 to 2.5 volt range of the A/D converter. This permits operation with a low cost microprocessor having only an eight bit A/D converter. Although the operation has been described for use with an eight bit A/D, it will be apparent to those of ordinary skill in the art that the circuitry of the present invention can also be scaled for use with 16-bit or other types of A/D converters. Furthermore, although the A/D converter is shown as an on board function supplied in the microprocessor U1, it will be apparent that the A/D converter can be supplied as a separate component.

The output of the AC attenuation circuit is directed to a rectifier circuit which converts AC voltages to DC voltages which can be processed by the A/D converter. The conversion to DC is performed by the rectifier circuit comprising D3, D4, D1, D2, and C5. The output DC voltage is then processed by the scaling circuit comprising R8, R9, and C6. This circuit acts as a voltage divider to voltages output from the rectifier circuit, and the components are preferably selected to scale both AC and DC input voltage values to the full scale of the A/D converter. The selected scaling provides maximum resolution for each of the AC and DC voltage scales for the given A/D converter. Although a full wave rectifier circuit is shown, it will be apparent that other types of rectifier circuits can also be used. Furthermore, although a simple voltage divider has been used to scale the voltage, a number of different scaling circuits will be apparent to those of skill in the art.

The continuity check circuit 33a, 33b is also shown in Block 30. In the continuity check circuit 33a, one terminal of the BATTERY is connected to R6 which is connected to the RED terminal, and the other terminal is connected to GND. However no significant current will flow in this circuit since the path is blocked by either diodes or capacitors in the voltage processing circuit. However, if a conductor is coupled to both the RED and BLACK terminals another, new, current path back to the BATTERY is made available via R5 and Q1 of circuit 33b. The inverter comprising pins 5 and 6 of U2 monitors the voltage at the collector of transistor Q1. Current flowing into the base-emitter junction of Q1 causes the collector of Q1 to go low which in turn causes the output of U2 (pin 6) to go high (which is the same as point CONT on the schematic). This logic signal CONT is transmitted to the microprocessor U1 in microprocessor block 70. Resistor R14 provides biasing for Q1. Capacitor C2 is used to attenuate any spurious AC signals that may be picked up at the BLACK terminal. The unique design of the voltage processing circuit enables the simple design of the continuity circuit. Its very high impedance prevents the current from the battery from being detoured over to the BLACK terminal. Hence the current gets into BLACK lead only when the RED and BLACK probes are touched together, either directly or through a low-impedance conductor coupled between the RED and BLACK probes.

Block 40 contains the AC voltage sense detection circuit which, as output, provides a signal indicative of whether the non-contact sensor 11 or either of the contact voltage probes 19a and 19b has detected an AC voltage. First consider the non-contact sensing. The sensing element for non-contact voltage sensing is a conductor VS which is housed inside the non-contact sensor 11 portion which projects from the housing 26. The sensor VS is a plastic covered conductive element connected to R18, preferably constructed of copper although other metallic and conductive material capable of capacitively coupling a time varying electric field can also be used. The sensor VS is responsible for capacitively picking up AC voltages when placed near conductors with AC voltages impressed upon them. These induced AC voltages are conducted to the inverter comprising pins 13 and 12 of U3 via R18. Also connected to pin 13 of U3 is diode D7, the other end of which is connected to GND. As discussed below, D7 permits AC signals from the VOLTAGE PROBES or test leads 19a and 19b to also be presented to pin 13 of U3 via the GND connection. The two inverters comprising pins 13, 12, 11, and 10 of U3 serve to amplify the AC signal presented at pin 13 with the result given at pin 10. The components D8, R15 and C9 convert the AC signal at pin 10 of U3 to a DC logic level signal at pin 3 of U3. The logic signal is buffered by the two inverters of U3 denoted with pins 3, 4, 5, and 6, with pin 6 providing an output result and connected to point VSENS. The point VSENS is connected to the microprocessor in Block 70. The circuitry described above is not powered until the momentary switch 15 (SW1 connected to points SW1A and SW1B) is activated. When the momentary switch 15 is activated, the battery voltage is applied to the connection point VSON. This is a logic level signal and is presented to the microprocessor U1, in Block 70, as an indication that the switch 15 has been activated and is being held in an activated position. When the switch is activated, a regulated voltage is supplied to U3. This regulated supply voltage is necessary to provide proper operation of the voltage sensing circuit just described and is connected to pin 14 (the power supply pin) of U3. The voltage regulation is accomplished by means of R17, zener D9, and R16.

Single probe, AC voltage contact sensing is described as follows. Switch 15 (SW1) must be activated, as described above, to enable the AC voltage sense circuit of Block 40. If either of the probes 19a, 19b connected to the RED and BLACK terminals is brought into conductive contact with a conductor that has an AC voltage impressed upon it, the AC signal will be conducted to pin 13 of U3. In the case of the RED probe 19a the conducted path is via RED to R3 to C3 to GND and finally to diode D7 which is connected to pin 13 of U3. In the case of the BLACK terminal the conducted path is via BLACK to R4 to C4 to GND and finally to diode D7 which is connected to pin 13 of U3. The remainder of the circuitry beyond U3 (pin 13) acts upon the AC signal in exactly the same manner as if it were in the non-contact mode.

The function of Block 50 is to provide a visual indication of the results of the testing of an applied voltage, as determined by microprocessor operations described below. Block 50 comprises a plurality of LED's including the positive DC voltage indicator 12a, negative DC voltage indicator 12b, AC voltage indicator 16, AC voltage sense indicator 14, voltage scale indicator LED's 25, and the continuity LED indicator 18. As shown in FIG. 1a and FIG. 2, there are seven voltage scale indicator LEDs in the embodiment shown. For DC voltages, the associated voltage scale includes indicators for 6, 12, 24, 48, 110, and 220 VDC. For AC voltages, the scale includes 24, 120, 208, 240, 277, 480, and 600 VAC. In the preferred embodiment, one set of seven LED's 25 is used to indicate voltages in both the AC and DC ranges. However, it will be apparent that two sets of LED's could be used to independently indicate AC and DC voltages.

Block 60 includes an acoustic circuit for selectively producing an audible signal for a user. The microprocessor U1 in Block 70 controls this function via the signal SPE. When the signal SPE is high, a sound is emitted; otherwise no sound is emitted. Typically, sound is used in conjunction with the continuity check and AC voltage sense functions. Other uses of the acoustic circuit will be apparent.

The microprocessor U1 of Block 70 receives and processes digital and analog input signals from blocks 30 and 40 and drives audio and output signals in the blocks 50 and 60. The microprocessor U1 includes an A/D converter for converting the analog scaled version AN0 of the input voltage presented at the RED and BLACK terminals to a digital voltage value. This value is used by the microprocessor U1 of block 70 to determine which of the voltage range LED's 25 of Block 50 should be activated to provide an indication of the magnitude of the voltage. The microprocessor U1 also performs logic operations based on the +DC and −DC signals from Block 30 to determine the type (AC or DC) and polarity of the input voltage presented at the RED and BLACK terminals. Again, after determining the correct voltage type and polarity, the microprocessor U1 drives the LED's of Block 50 to provide an indication of the detected voltage. The microprocessor U1 also receives the input VSON activated by the switch 15 (SW1) and the VSENS output of the AC voltage sensing circuit, and drives the AC voltage sense LED 14 to an ON position when the switch is activated and a voltage has been detected at VSENS. The microprocessor U1 further provides a control signal SPE to enable the sound circuitry of Block 60. Such signals can be provided, for example, to indicate that a continuity check is positive or than an AC voltage has been sensed at VSENS.

The microprocessor U1 is programmed to remain in a sleep mode where it consumes very little power unless one of a number of predetermined conditions are detected, and therefore no power on/off switch is required. The microprocessor U1 enters the sleep mode immediately after batteries are installed. The microprocessor U1 emerges from the sleep mode (i.e. wakes up) upon the detection of an input voltage caused by any of the following: a continuity signal CONT detected at pin 26, the depression of the momentary switch 15 (SW1) causing a signal VSON at pin 25, the detection of a voltage at the +DC and/or −DC inputs at pins 27 or 28, or the detection of a voltage VSENS at pin 24 in the non contact mode. Upon receipt of any of the described signals, the microprocessor will process all of its inputs in accordance with the required functions noted above until all of the inputs that caused the wakeup to occur have ceased. Upon this cessation, it will revert to the sleep mode. The sleep mode is preferably provided as a standard option in the selected microprocessor U1, but can be programmed independently.

Thus it is seen that only a limited number of switches are required in the electrical testing device of the present invention. No switches, knobs or electrical actuators are needed to activate the instrument for the purpose of voltage measurement or continuity testing. Range and polarity selection are automatically provided through the circuitry of Block 30. Non-contact or single probe AC contact sensing requires only the activation of a single switch 15.

The disclosed invention can be seen to present clear advantages and improvements in the field of automatic voltage and continuity testing while incorporating contact and non-contact AC voltage sensing functions. Although a preferred embodiment of the invention has been shown and described, variations and modifications obvious to persons skilled in the art are possible without deviating from the spirit of the invention. For example, although Block 70 has been shown as comprising a microprocessor U1, it will be apparent that a number of different types of programmable controllers or discrete logic gates could be used in place of the microprocessor circuit. Furthermore, although a specific display circuit comprising a plurality of light emitting diodes has been shown, it will be apparent that a number of different types of light emitting devices, liquid crystal display elements, character or other displays can also be used. Also, although a momentary switch 15 has been described, it will be apparent that a number of different electrical actuating devices can be used. Additionally, although an electrical testing device has been shown comprising a number of pre-selected component values, it will be apparent that the range of the electrical testing device and other operational parameters can be varied by modifying component values.

We claim:

1. An electrical testing device, comprising:

a housing;

a display visible from outside of said housing;

a pair of test probes;

a voltage sensing circuit contained within said housing and electrically connected to said test probes and to said display, said voltage sensing circuit detecting when said test probes are electrically coupled each to a different one of two conductors between which an AC or DC voltage difference exists and outputting a signal to said display which indicates to a user the magnitude of the voltage between the conductors;

a non-contact voltage sensor;

a voltage sense indicator; and a non-contact AC voltage sense circuit for detecting when said non-contact voltage sensor is capacitively coupled to a conductor carrying an AC voltage and outputting a signal to said voltage sense indicator to indicate to a user that said AC voltage is sensed.

2. An electrical testing device as defined in claim 1, wherein said non-contact voltage sensor is in a projection of the housing.

3. An electrical testing device as in claim 1, further comprising circuitry that indicates to a user when a single one of the probes is placed in contact with a conductor on which a voltage is impressed.

* * * * *

UNITED STATES PATENT AND TRADEMARK OFFICE
CERTIFICATE OF CORRECTION

PATENT NO. : 6,812,685 B2
DATED : November 2, 2004
INVENTOR(S) : George R. Steber et al.

It is certified that error appears in the above-identified patent and that said Letters Patent is hereby corrected as shown below:

Column 3,
Line 31, "batter" should be -- battery --.

Column 8,
Line 54, "24, 48" should be -- 24, 34, 48 --.

Signed and Sealed this

Fifteenth Day of March, 2005

JON W. DUDAS
*Director of the United States Patent and Trademark Office*